United States Patent
Lee et al.

(10) Patent No.: US 7,876,609 B2
(45) Date of Patent: Jan. 25, 2011

(54) NONVOLATILE MEMORY DEVICE AND RELATED METHODS OF OPERATION

(75) Inventors: Kwang-jin Lee, Hwaseong-si (KR); Choong-keun Kwak, Suwon-si (KR); Du-eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/720,918

(22) Filed: Mar. 10, 2010

(65) Prior Publication Data

US 2010/0165729 A1    Jul. 1, 2010

Related U.S. Application Data

(63) Continuation of application No. 11/834,843, filed on Aug. 7, 2007, now Pat. No. 7,688,620.

(30) Foreign Application Priority Data

Sep. 4, 2006    (KR) ............... 10-2006-0084865

(51) Int. Cl.
*G11C 11/00* (2006.01)
(52) U.S. Cl. .................. 365/163; 365/189.011
(58) Field of Classification Search ............ 365/163, 365/189.011
See application file for complete search history.

(56) References Cited

U.S. PATENT DOCUMENTS

| | | | |
|---|---|---|---|
| 6,587,394 B2 | 7/2003 | Hogan | |
| 6,853,603 B1 | 2/2005 | White et al. | |
| 7,394,700 B2 * | 7/2008 | Park et al. | 365/185.22 |
| 2002/0174310 A1 | 11/2002 | Ueyama | |

FOREIGN PATENT DOCUMENTS

| | | |
|---|---|---|
| JP | 2000040383 | 2/2000 |
| JP | 2004095029 | 3/2004 |
| JP | 2004310477 | 11/2004 |
| KR | 1020020047772 A | 6/2002 |
| KR | 1020050069925 A | 7/2005 |

* cited by examiner

*Primary Examiner*—Son Dinh
*Assistant Examiner*—Nam Nguyen
(74) *Attorney, Agent, or Firm*—Volentine & Whitt, PLLC

(57) ABSTRACT

In a nonvolatile memory device, a program operation is performed on a plurality of nonvolatile memory cells by programming data having a first logic state in a first group among a plurality of selected memory cells selected from the plurality of nonvolatile memory cells during a first program interval of the program operation, and thereafter, programming data having a second logic state different from the first logic state in a second group among the selected memory cells during a second program interval of the program operation after the first program interval.

20 Claims, 12 Drawing Sheets

NONVOLATILE MEMORY DEVICE AND RELATED METHODS OF OPERATION

CROSS REFERENCE TO RELATED APPLICATIONS

This application is a continuation of U.S. patent application Ser. No. 11/834,843 filed on Aug. 7, 2007, which claims priority to Korean Patent Application No. 10-2006-0084865, filed on Sep. 4, 2006. The subject matter of both of these applications is hereby incorporated by reference in their entirety.

BACKGROUND OF THE INVENTION

1. Field of the Invention

Embodiments of the present invention relate generally to nonvolatile memory devices and related methods of operation. More particularly, embodiments of the invention relate to nonvolatile memory devices and related programming methods.

2. Description of the Related Art

A variety of nonvolatile memory devices use resistance materials to store data. For example, Phase Change Random Access Memory (PRAM), Resistive RAM (RRAM), Ferroelectric RAM (FRAM), and Magnetic RAM (MRAM) all use resistance materials to store data. In contrast to other forms of memory such as dynamic random access memory (DRAM) and flash memory, which store data using charges, devices using resistance materials tend to store the data by physically modifying the resistance materials. For instance, a PRAM typically stores data using different states of a phase change material such as a chalcogenide alloy, a RRAM typically stores data using different resistance values of a variable resistance material, a FRAM typically stores data using a polarization phenomenon of a ferroelectric material, and a MRAM typically stores data using a resistance variation of a magnetic tunnel junction (MTJ) thin film in response to a magnetization state of a ferromagnetic material.

To illustrate one way that resistance materials can be used to store data, an exemplary PRAM will now be described in further detail. The phase change material in a PRAM, typically chalcogenide, is capable of stably transitioning between amorphous and crystalline phases. The amorphous and crystalline phases (or states) exhibit different resistance values used to distinguish different logic states of memory cells in the memory devices. In particular, the amorphous phase exhibits a relatively high resistance and the crystalline phase exhibits a relatively low resistance.

The PRAM uses the amorphous state to represent a logical "1" (or data "1") and the crystalline state to represent a logical "0" (or data "0"). In a PRAM device, the crystalline state is referred to as a "set state" and the amorphous state is referred to as a "reset state". Accordingly, a memory cell in a PRAM stores a logical "0" by setting a phase change material in the memory cell to the crystalline state, and the memory cell stores a logical "1" by setting the phase change material to the amorphous state. Various PRAM devices are disclosed, for example, in U.S. Pat. Nos. 6,487,113 and 6,480,438.

The phase change material in a PRAM is converted to the amorphous state by heating the material to a first temperature above a predetermined melting temperature and then quickly cooling the material. The phase change material is converted to the crystalline state by heating the material at a second temperature lower than the melting temperature but above a crystallizing temperature for a sustained period of time. Accordingly, data is programmed to memory cells in a PRAM by converting the phase change material in memory cells of the PRAM between the amorphous and crystalline states using heating and cooling as described above.

The phase change material in a PRAM typically comprises a compound including germanium (Ge), antimony (Sb), and tellurium (Te), ie., a "GST" compound. The GST compound is well suited for a PRAM because it can quickly transition between the amorphous and crystalline states by heating and cooling. In addition to, or as an alternative for the GST compound, a variety of other compounds can be used in the phase change material. Examples of the other compounds include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AgInSbTe, (GeSn)SbTe, GeSb(SeTe), and $Te_{81}Ge_{15}Sb_2S_2$.

The memory cells in a PRAM are called "phase change memory cells". A phase change memory cell typically comprises a top electrode, a phase change material layer, a bottom electrode contact, a bottom electrode, and an access transistor. A read operation is performed on the phase change memory cell by measuring the resistance of the phase change material layer, and a program operation is performed on the phase change memory cell by heating and cooling the phase change material layer as described above.

In general, the program operation is carried out by applying an electrical "set" or "reset" pulse to the electrode to change the phase change material layer to the "set" or "reset" state. Typically, the time required to program data "0" to a memory cell is about five times the time required to program data "1" to the memory cell. For example, the time required to program data "0" may be about 600 ns, while the time required to program data "1" may be about 120 ns.

Unfortunately, conventional PRAM devices can receive several bits of input at the same time but are unable to simultaneously program the bits into corresponding memory cells. For example, a PRAM may receive 16 inputs through a plurality of pins, but the PRAM may not be able to simultaneously access 16 phase change memory cells. One reason for this shortcoming is that if a current of 1 mA is required to program one phase change memory cell, then a current of 16 mA would be required to simultaneously program 16 phase change memory cells. Moreover, if the efficiency of a driver circuit providing the current is 10%, then in reality, a current of 160 mA would be required to simultaneously program the 16 memory cells. However, conventional PRAM devices are generally not equipped to provide currents with such high magnitudes.

Since a program driver in a PRAM device can only provide a limited amount of current, a program operation of several phase change memory cells can be divided into several "division program operations" each requiring only a fraction of the total current required to program all of the several phase change memory cells. In each division program operation, a subset (i.e., a "division") of memory cells among a larger group are programmed. For example, a group of sixteen phase change memory cells can be programmed by dividing the sixteen phase change memory cells into eight groups (i.e., divisions) of two and simultaneously programming the two memory cells in each group of two in eight successive division program operations.

To prevent unnecessary current consumption and programming failures, the PRAM device may also perform a verify read operation to verify the program status of each selected memory cell. To perform the verify read operation, program data to be programmed in the selected memory cells is stored in a temporary storage location such as a program buffer.

Next, the program data is programmed into selected cells. Then, the data stored in the selected memory cells is read and compared with the program data stored in the temporary storage location. Where the data stored in the temporary storage location is different from the data stored in the selected memory cells, the verify read operation indicates a program failure. Otherwise, the verify read operation indicates a program success.

FIG. 1 is a conceptual timing chart illustrating a conventional method of operating a PRAM device that uses division program operations. For explanation purposes, it will be assumed that a program operation of the PRAM device programs 16 bits of data to 16 selected memory cells divided into eight pairs, or groups, using eight division program operations.

Referring to FIG. 1, data is programmed in the PRAM device using a plurality of program loops (L=1 through 11). Before each program loop begins, a verify read operation is performed to detect memory cells, among the selected memory cells, that have not been successfully programmed. Thereafter, a division program operation is performed on groups of memory cells where at least one memory cell has not been successfully programmed—referred to as "failed groups" (incidentally, individual memory cells that have not been successfully programmed will be referred to as "failed cells"). In the example of FIG. 1, eight division program operations ① through ⑧ correspond to eight respective cell groups.

In a program operation, all eight groups of memory cells generally begin as failed groups. Accordingly, in the first program loop (L=1), a division program operation is typically executed for each of the eight groups. In the second program loop (L=2), assuming that the third and fourth groups have been successfully programmed, a division program operation is performed on all eight groups, except for the third and fourth groups. Similarly, in remaining program loops, fewer groups are programmed as more groups become successfully programmed.

Unfortunately, conventional processes such as that described above do not take into account the fact that different program times are required to program data "0" and data "1" to selected memory cells. As a result, the duration of each division program operation may be required to be as long as the duration of a set pulse used to program data "0" even if some memory cells corresponding to the division program operation will only be programmed with data "1". Accordingly, the time required to perform program operations may be unnecessarily large.

SUMMARY OF THE INVENTION

Embodiments of the invention provide nonvolatile memory devices and related methods capable of reducing the amount of time required to perform program operations.

According to one embodiment of the invention, a method of performing a program operation in a nonvolatile memory device is provided. The device comprises a memory cell array, wherein the memory cell array comprises a plurality of nonvolatile memory cells. The method comprises, during a first program interval of the program operation, programming data having a first logic state in a first group among a plurality of selected memory cells selected from the plurality of nonvolatile memory cells, and during a second program interval of the program operation after the first program interval, programming data having a second logic state different from the first logic state in a second group among the selected memory cells.

According to another embodiment of the invention, a method of performing a program operation in a nonvolatile memory device is provided. The device comprises a memory cell array, wherein the memory cell array comprises a plurality of nonvolatile memory cells. The method comprises identifying a first group of "a" ("a" is a natural number) failed nonvolatile memory cells among the plurality of nonvolatile memory cells, wherein the first group of failed nonvolatile memory cells are to be programmed to a first logic state, and programming the first group of failed nonvolatile memory cells with the first logic state using "m" ("m" is a natural number) division program operations during a first program interval of the program operation, and identifying a second group of "b" ("b" is a natural number) failed nonvolatile memory cells among the plurality of nonvolatile memory cells, wherein the second group of failed nonvolatile memory cells are to be programmed to a second logic state, and programming the group of failed nonvolatile memory cells with the second logic state using "n" ("n" is a natural number) division program operations during a second program interval of the program operation after the first program interval.

According to another embodiment of the invention, a nonvolatile memory device is provided. The device comprises a memory cell array comprising a plurality of nonvolatile memory cells, and a program circuit. The program circuit is adapted to program data having a first logic state in a first group among a plurality of selected memory cells selected from the plurality of nonvolatile memory cells during a first program interval of a program operation, and further adapted to program data having a second logic state different from the first logic state in a second group among the selected memory cells during a second program interval of the program operation after the first program interval.

According to still another embodiment of the invention, a nonvolatile memory device is provided. The device comprises a memory cell array comprising a plurality of nonvolatile memory cells, and a program circuit. The program circuit is adapted to identify a first group of "a" ("a" is a natural number) failed nonvolatile memory cells among the plurality of nonvolatile memory cells, wherein the first group of failed nonvolatile memory cells are to be programmed to a first logic state, and to program the first group of failed nonvolatile memory cells with the first logic state using "m" ("m" is a natural number) division program operations during a first program interval of the program operation, and further adapted to identify a second group of "b" ("b" is a natural number) failed nonvolatile memory cells among the plurality of nonvolatile memory cells, wherein the second group of failed nonvolatile memory cells are to be programmed to a second logic state, and to program the group of failed nonvolatile memory cells with the second logic state using "n" ("n" is a natural number) division program operations during a second program interval of the program operation after the first program interval.

According to still another embodiment of the invention, a nonvolatile memory device comprises a plurality of nonvolatile memory cells divided into a plurality of cell groups, a comparing unit, a status flag signal generating unit, a program verifying designating unit, a program pulse generating unit, and a program driver. The comparing unit compares a plurality of verification data read from the plurality of nonvolatile memory cells with a plurality of program data to be programmed in the plurality of nonvolatile memory cells, and outputs comparison signals indicating a plurality of failed nonvolatile memory cells whose verification data and program data are different from each other. The status flag signal generating unit generates status flag signals indicating a plurality of nonvolatile memory cells where program data of a particular logic state is to be programmed. The program verifying designating unit receives the comparison signals and the status flag signal and generates designating signals for designating a plurality of division program operations used to program data in failed nonvolatile memory cells. The program pulse generating unit receives the designating signals and supplies a set pulse control signal and a reset pulse control signal during division program operations. The program driver receives the program data, the set pulse control signal, and the reset pulse control signal, and generates a set pulse or a reset pulse.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Although a PRAM device is used to illustrate several embodiments of the invention, it should be understood that the invention may be embodied in a variety of different forms. For example, the PRAM device could be replaced by other types of nonvolatile memory devices using resistance materials, such as RRAM, FRAM, and MRAM.

Figure 2:
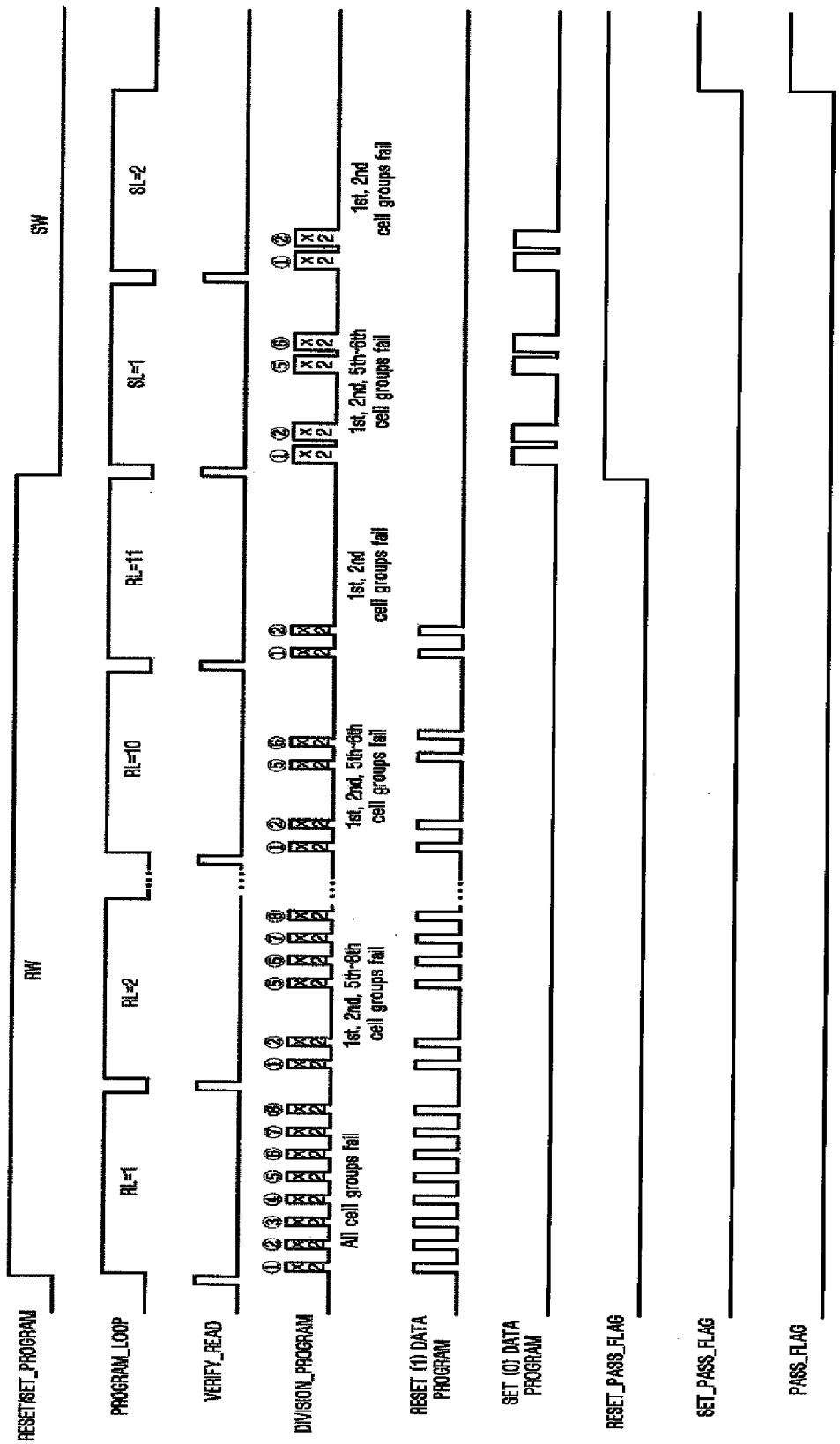
FIG. 2 is a conceptual timing chart illustrating a method of programming a PRAM device in accordance with an embodiment of the invention.
Figure 3:
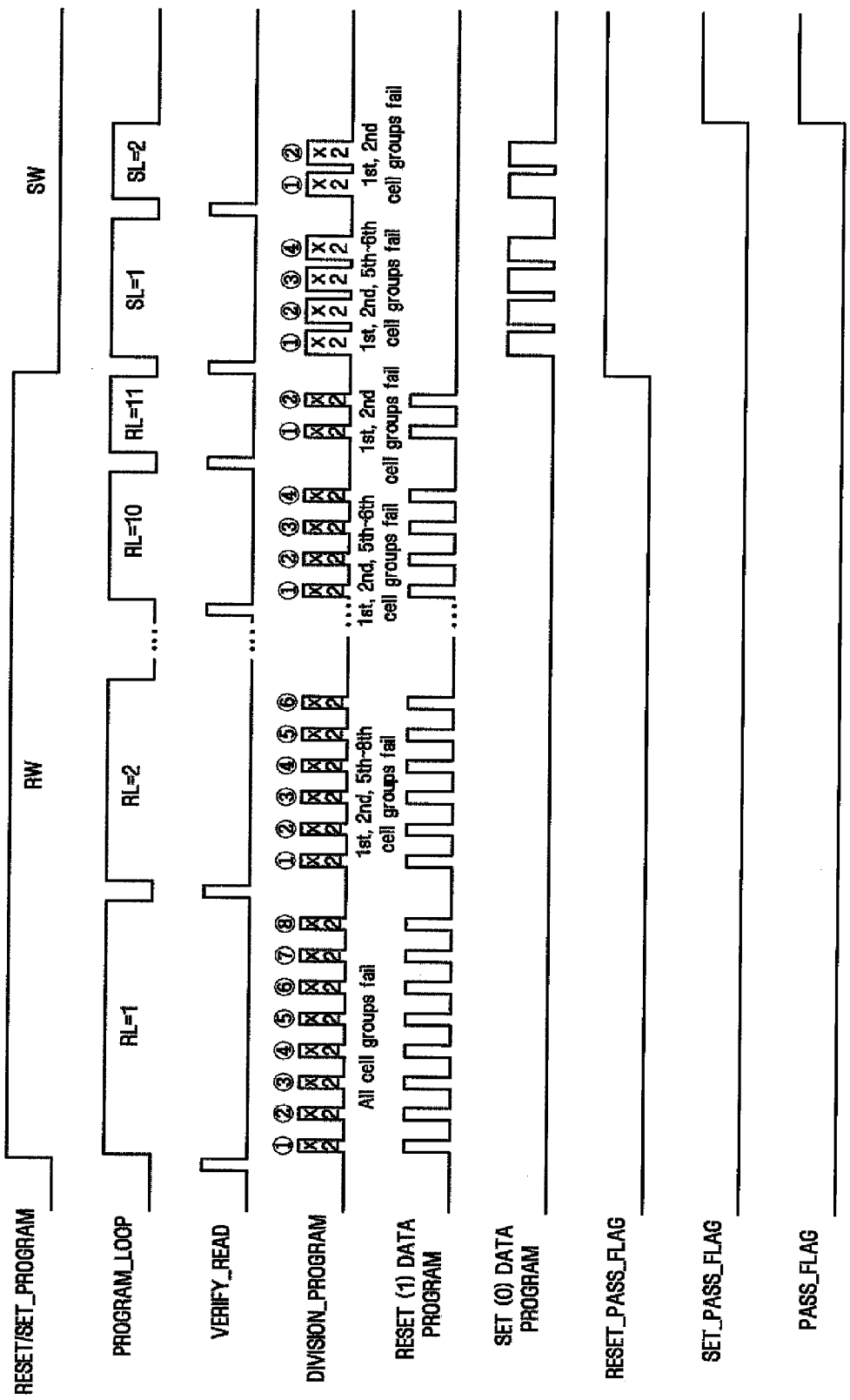
FIG. 3 is a conceptual timing chart illustrating a method of programming a PRAM device in accordance with another embodiment of the invention.

FIGS. 2 and 3 are conceptual timing charts illustrating methods of programming a PRAM device according to selected embodiments of the invention.

Referring to FIGS. 2 and 3, selected memory cells to be programmed to the same state are programmed at the same time. For instance, selected memory cells to be programmed with data "0" may be programmed first, followed by selected memory cells to be programmed with data "1". Similarly, selected memory cells capable of storing more than one bit may be programmed in an order based on their intended state, e.g., data may be programmed in an order of data "0", data "1", data "2", etc.

In selected embodiments of the invention program methods for PRAM devices include division program operations and verify read operations. However, the invention is not limited to using these types of operations. For instance, division program operations could be unaccompanied by verify read operations, or vice versa, or program operations could be performed without either division program operations or verify read operations.

Referring to FIG. 2, in a PRAM device according to an embodiment of the invention, data "1" is programmed to selected memory cells during a program interval RW, and data "0" is programmed to a subset of the selected memory cells during a program interval SW.

Program interval RW spans eleven program loops RL=1 through 11, and program interval SW spans two program loops SL=1 and 2. Before each program loop, a verify read operation VERIFY_READ is performed. During each program loop, a division program operation is performed only on groups of memory cells including at least one memory cell that has not been successfully programmed, i.e., "failed groups".

For explanation purposes, it will be assumed that sixteen bits of data are simultaneously input to the PRAM device via sixteen input/output (IO) pins. The sixteen bits are then programmed into sixteen selected Phase change memory cells in eight groups of two cells each, as illustrated, e.g., in Table 1 below. In the example of Table 1, a first group consists of memory cells corresponding to zero-th and eighth IO pins IO0 and IO8, a second group consists of memory cells corresponding to first and ninth IO pins IO1 and IO9, and so on. Data is simultaneously programmed into the two memory cells of each group, while memory cells in different groups are programmed at different times.

For explanation purposes, it will be assumed that the data to be programmed into the selected memory cells has values shown in Table 1 by the label "Program data". In particular, data "1" and "0" is to be programmed into the memory cells corresponding to IO pins 0 and 8, respectively, data "1" and "1" is to be programmed into the memory cells corresponding to IO pins 2 and 10, respectively, and so on.

Table 2 illustrates groups of memory cells to be programmed during program interval RW and program interval SW. As seen in Table 2, all groups of memory cells are programmed during program interval RW, and groups of memory cells where at least one memory cell is to be programmed with data "0" are programmed during program interval SW.

TABLE 1

| IO pin | {0, 8} | {1, 9} | {2, 10} | {3, 11} | {4, 12} | {5, 13} | {6, 14} | {7, 15} |
|---|---|---|---|---|---|---|---|---|
| Program data | 1, 0 | 1, 0 | 1, 1 | 1, 1 | 1, 0 | 1, 0 | 1, 1 | 1, 1 |
| Group | 1 | 2 | 3 | 4 | 5 | 6 | 7 | 8 |

TABLE 2

|  | Program interval RW | Program interval SW |
|---|---|---|
| Group | 1, 2, 3, 4, 5, 6, 7, 8 | 1, 2, 5, 6 |

A first verify read operation is performed before the first program loop (RL=1) in program interval RW. Then, the memory cells in all eight groups are programmed with data "1" in eight corresponding division program operations. A verify read operation is performed thereafter to detect memory cells that have been successfully/unsuccessfully programmed. Then, based on the detection, memory cells in "failed groups" are again programmed with data "1". For example, in the second program loop (RL=2) of program interval RW, groups 1, 2, and 5-8 are programmed with data "1". The process of executing successive verify read operations and program loops continues through the eleventh program loop (RL=11) of program interval RW, assuming that not all of the selected memory cells are successfully programmed with data "1" until the eleventh program loop.

After the eleventh program loop, no more failed groups remain among the first through eighth groups. Accordingly, a reset pass flag signal RESET_PASS_FLAG is activated, indicating successful programming of data "1" to all eight groups.

Next, data "0" is programmed to a subset of the selected memory cells during program interval SW. More particularly, at the beginning of program interval SW, a verify read operation is performed to detect whether each of the subset of selected memory cells has been successfully programmed with data "0". Since the first, second, fifth and sixth groups initially include memory cells that have not been successfully programmed with data "0", division program operations corresponding to these groups are performed in the first program loop (SL=1) of program interval SW. Then, in the second program loop (SL=2) of program interval SW, division program operations corresponding to the first and second groups are performed after detecting that all of the memory cells in remaining groups have been successfully programmed.

After the second program loop of program interval SW, all of the subset of the selected memory cells are successfully programmed with data "0". Accordingly, a set pass flag signal SET_PASS_FLAG is activated, indicating successful programming of data "0" to the subset of the selected memory cells. In addition, a pass flag signal PASS_FLAG is activated, indicating successful programming of all of the selected memory cells.

The program operation illustrated in FIG. 2 can be roughly conceptualized as follows. Selected memory cells are programmed with data having a first state during a first program interval comprising a first number of division program operations. Next, a subset of the selected memory cells are programmed with data having a second state during a second program interval comprising a second number of division program operations. Because programming phase change memory cells to different states requires different amounts of time, the program operation of FIG. 2 tends to require less time compared with conventional program operations.

Referring to FIG. 3, in a PRAM device according to another embodiment of the invention, selected memory cells are programmed with data "1" during program interval RW, and a subset of the selected memory cells are programmed with data "0" during program interval SW. In the embodiment of FIG. 3, the duration of each program loop RL in program interval RW and the duration of each program loop SL in program interval SW is adjusted according to the number of division program operations to be performed within each loop. A program operation having this adjustment property or capability is referred to as an "adaptive program operation".

The method of FIG. 3 is similar to the method of FIG. 2, and therefore a detailed description of at least some features common to FIGS. 2 and 3 will be omitted to avoid redundancy. For example, like the method of FIG. 2, the method of FIG. 3 performs eight division program operations in the first program loop of program interval RW, and performs fewer division program operations in subsequent program loops of program interval RW. Next, in the first program loop of program interval SW, division program operations are performed on groups of memory cells to be programmed with data "0", and in the second program loop of program interval SW, division program operations are performed on groups including remaining memory cells to be programmed with data "0".

In contrast to the method of FIG. 2, however, it can be seen in FIG. 3 that the duration of program loops in program interval RW and program interval SW tends to decrease monotonically. These adjustments are made to account for decreases in the total amount of time required to complete the division program operations of each program loop.

In order to implement the method of FIG. 3, the timing of division program operations is adjusted by time shifting, or more generally, through timing reorganization or rearrangement. For example, in the method of FIG. 3, during the tenth program loop of program interval RW, division program operations for the fifth and sixth groups of memory cells are time shifted such that a time gap present in the tenth program loop of program interval RW in FIG. 2 is removed.

Figure 4A:
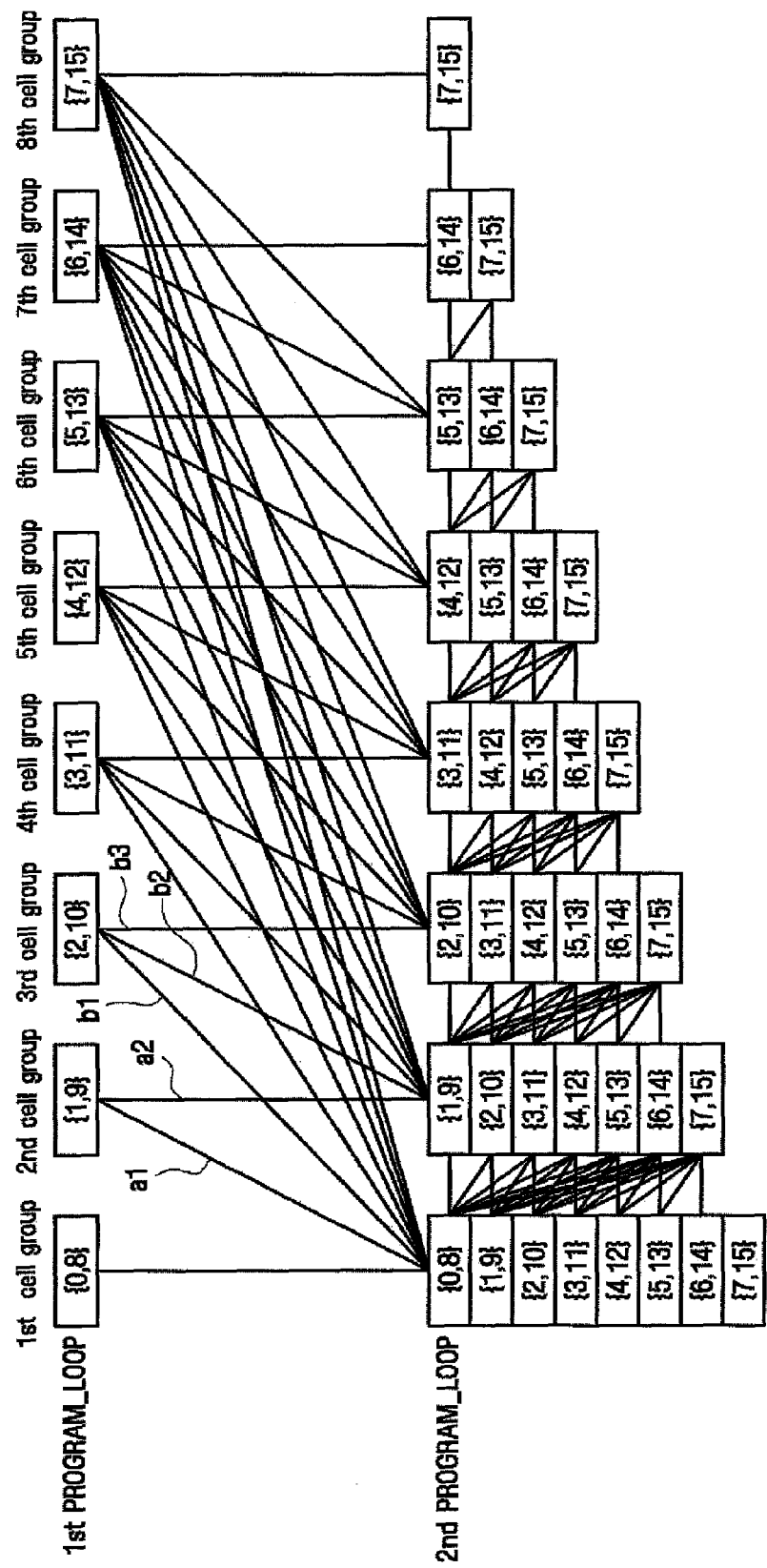
FIGS. 4A and 4B are conceptual diagrams illustrating a technique for adjusting the timing of execution for division program operations according to an embodiment of the invention.
Figure 4B:
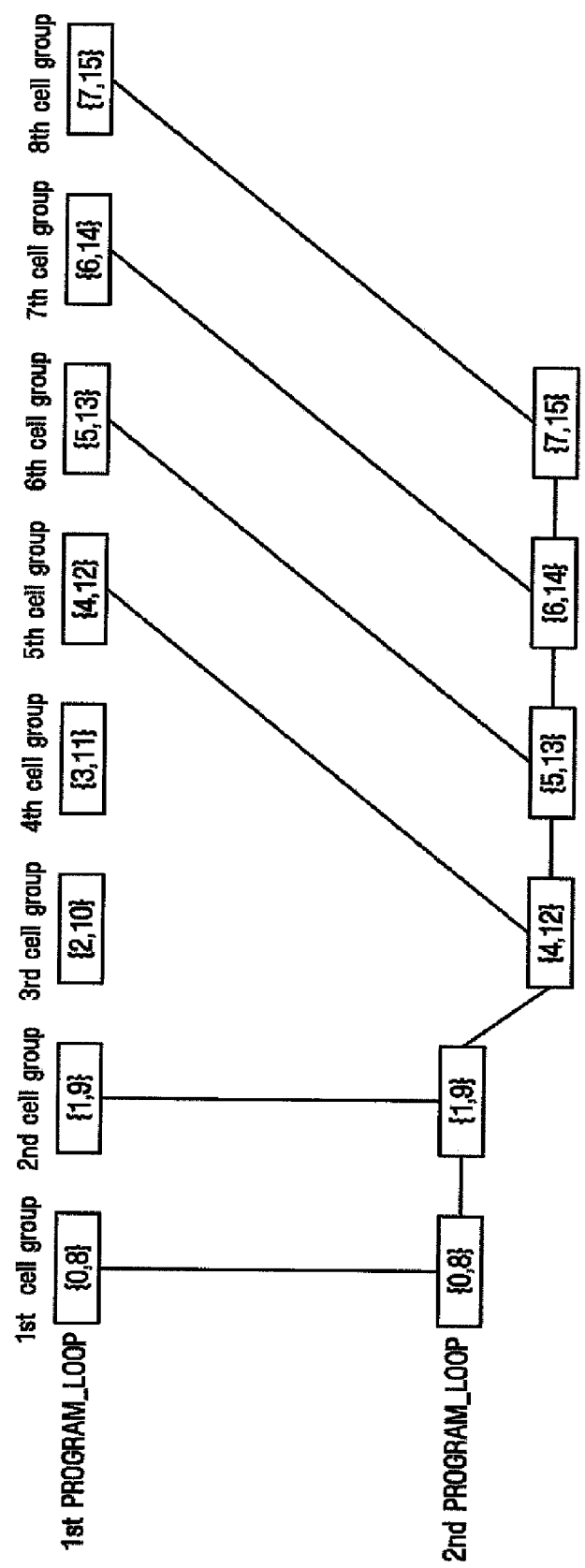
Figure 5A:
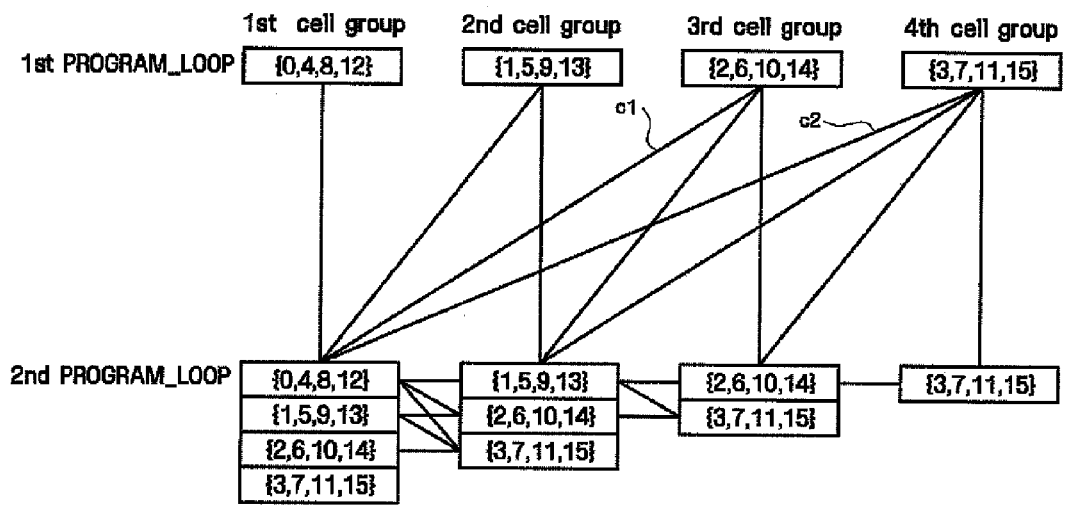
FIGS. 5A and 5B are conceptual diagrams illustrating a technique for adjusting the timing of execution for division program operations according to another embodiment of the invention.
Figure 5B:
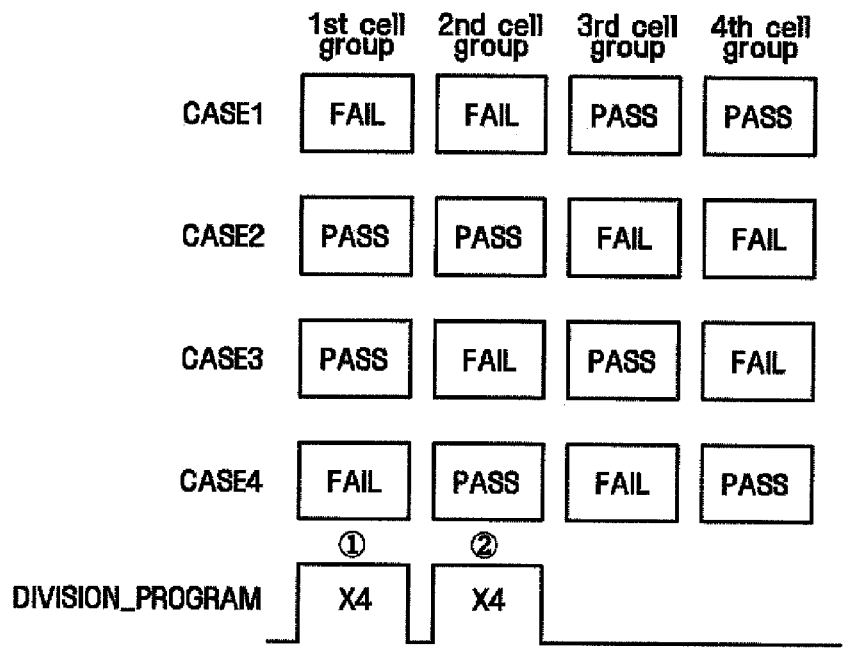
Figure 6:
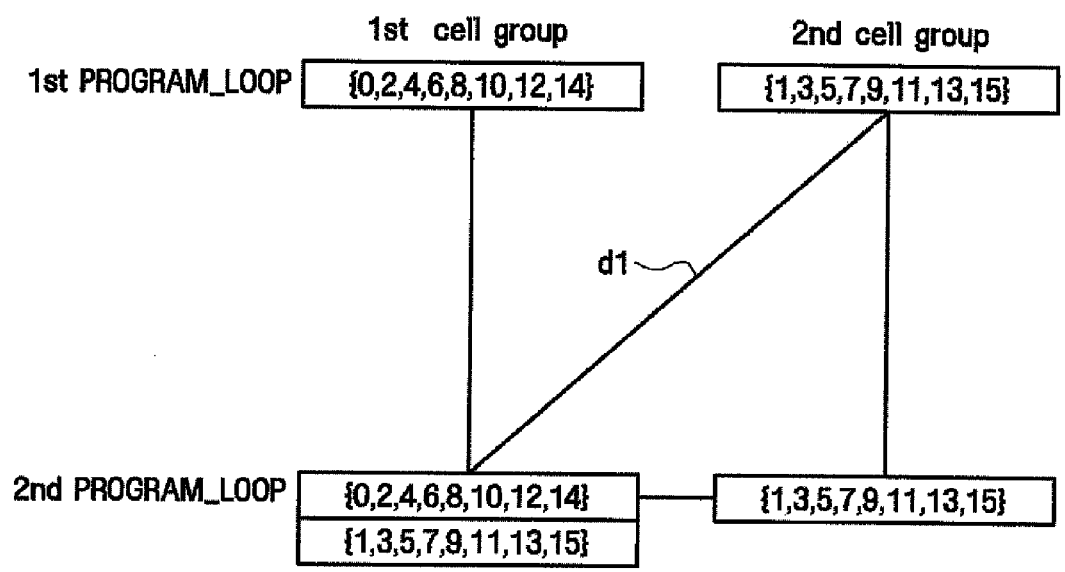
FIG. 6 is a conceptual diagram illustrating a technique for adjusting the timing of execution for division program operations according to yet another embodiment of the invention.

FIGS. 4 through 6 are conceptual diagrams illustrating various techniques that can be used to implement time shifting such as that illustrated in FIG. 3. For explanation purposes, it will be assumed that the time shifting of FIGS. 4 through 6 causes division program operations to be performed in different "time slots". For instance, in a technique illustrated in FIGS. 4A and 4B, first through eighth cell groups are programmed during respective first through eighth time slots during a first program loop. Then, in a second program loop, the fifth through eighth cell groups are "shifted" such that they are programmed during the third through sixth time slots, respectively.

In FIGS. 4A and 4B, each box represents a cell group corresponding to selected memory cells represented by numbers in brackets. Solid lines represent potential time shifts between successive program loops; however, whether time shifts actually occur depends on whether cell groups are successfully programmed during each program loop. For instance, in the example of FIGS. 4A and 4B, the third and fourth cell groups are successfully programmed during the first program loop while the remaining cell groups are not. Accordingly, the timing of the fifth through eighth cell groups is shifted for the second program loop.

FIGS. 5A and 6 are similar to FIG. 4A, except that in FIGS. 5A and 6, it is assumed that each cell group includes a larger number of memory cells. For example, in FIG. 5A, it is assumed that each cell group contains four memory cells to be simultaneously programmed and in FIG. 6, it is assumed that each cell group contains eight memory cells to be simultaneously programmed.

FIG. 5B shows examples of different events that can occur in a particular program loop of a PRAM using groups of four memory cells as in FIG. 5A. Referring to FIG. 5B, in an event labeled "CASE1", the first and second cell groups are not successfully programmed in a first program loop but the third and fourth cell groups are successfully programmed. Accordingly, a second program loop performs division program operations on the first and second cell groups, but not on the third and fourth cell groups, as illustrated at the bottom of FIG. 5B. Although the diagram of FIG. 5B does not show an exhaustive set of all possible events, a few other possible events are illustrated as examples, albeit without accompanying waveform diagrams.

By programming data "1" and data "0" in separate program intervals, and by adjusting the duration of each program loop in accordance with the number of division program operations to be performed in the loop, the methods illustrated in FIGS. 3 through 6 may significantly reduce the amount of time required to perform program operations.

Figure 1:
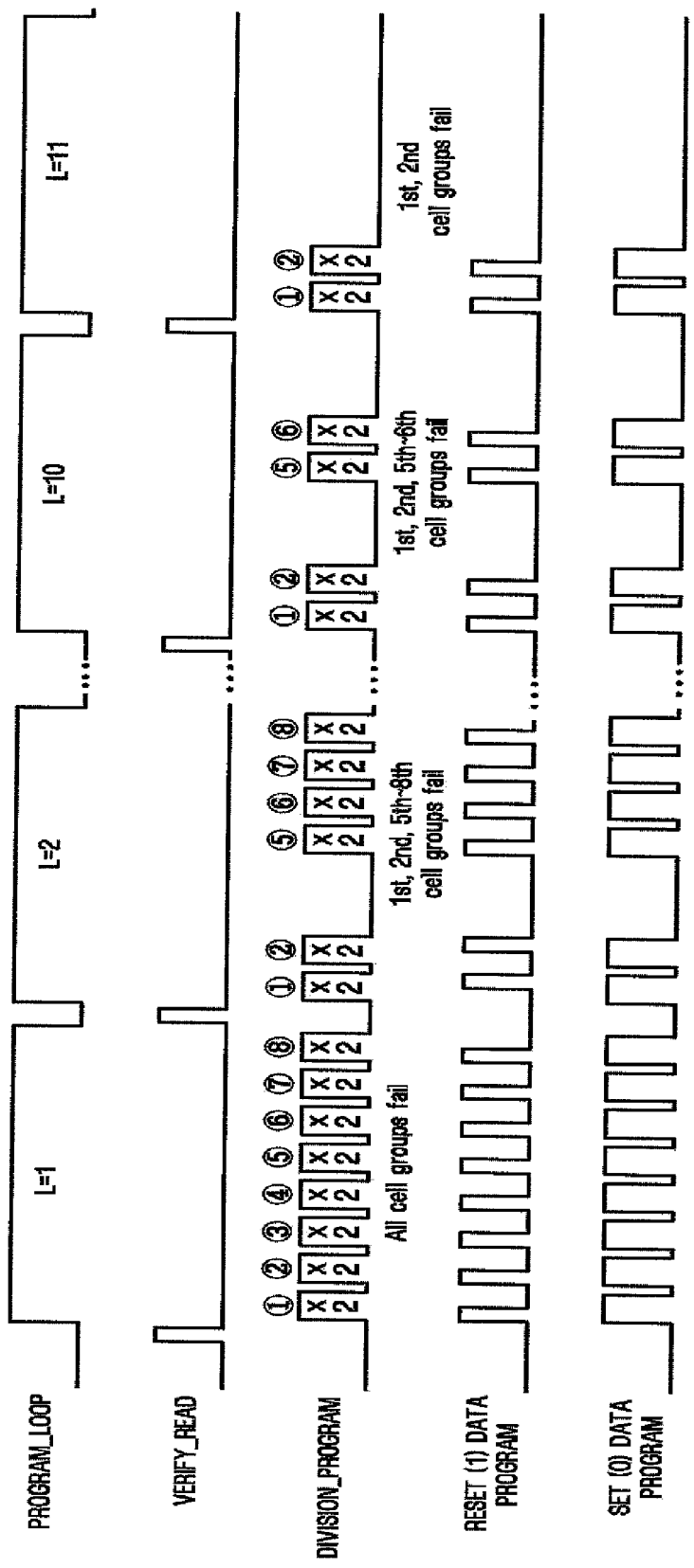
FIG. 1 is a conceptual timing chart illustrating a conventional method of operating a PRAM device that uses division program operations and verify read operations.

To illustrate the time reduction, the duration of a division program operation for programming data "1" will be represented as "T", and the duration of a division program operation for programming data "0" will be represented as "5T", assuming that the time required to program data "0" is around five times the time required to program data "1". Under this assumption, a comparison of the times required to perform program operations using the methods of FIGS. 1 through 3 is illustrated in Table 3 below. In Table 3, it will be assumed that eight cell groups are programmed in eight different division program operations during each program loop.

TABLE 3

| Classification | Method of FIG. 1 | Method of FIG. 2 | Method of FIG. 3 |
| --- | --- | --- | --- |
| Program time | (8 × 5T) = 40T | data "1": (8 × T) = 8T data "0": (8 × 5T) = 40T | data "1": ≦ (8 × T) = 8T data "0": ≦ (8 × 5T) = 40T |

As seen in Table 3, the total duration of the division program operations in each program loop in the method of FIG. 1 is always 40T. The total duration of the division program operations in each program loop in the method of FIG. 2 is 8T or 40T, depending on whether data "1" is being programmed or data "0" is being programmed. The total duration of the division program operations in each program loop in the method of FIG. 3 is at most 8T or 40T, depending on whether data "1" is being programmed or data "0" is being programmed. Accordingly, where the number of program loops required to program data "0" is relatively small compared with the number of program loops required to program data "1", the methods of FIGS. 2 and 3 will tend to take less time than the method of FIG. 1.

Figure 7:
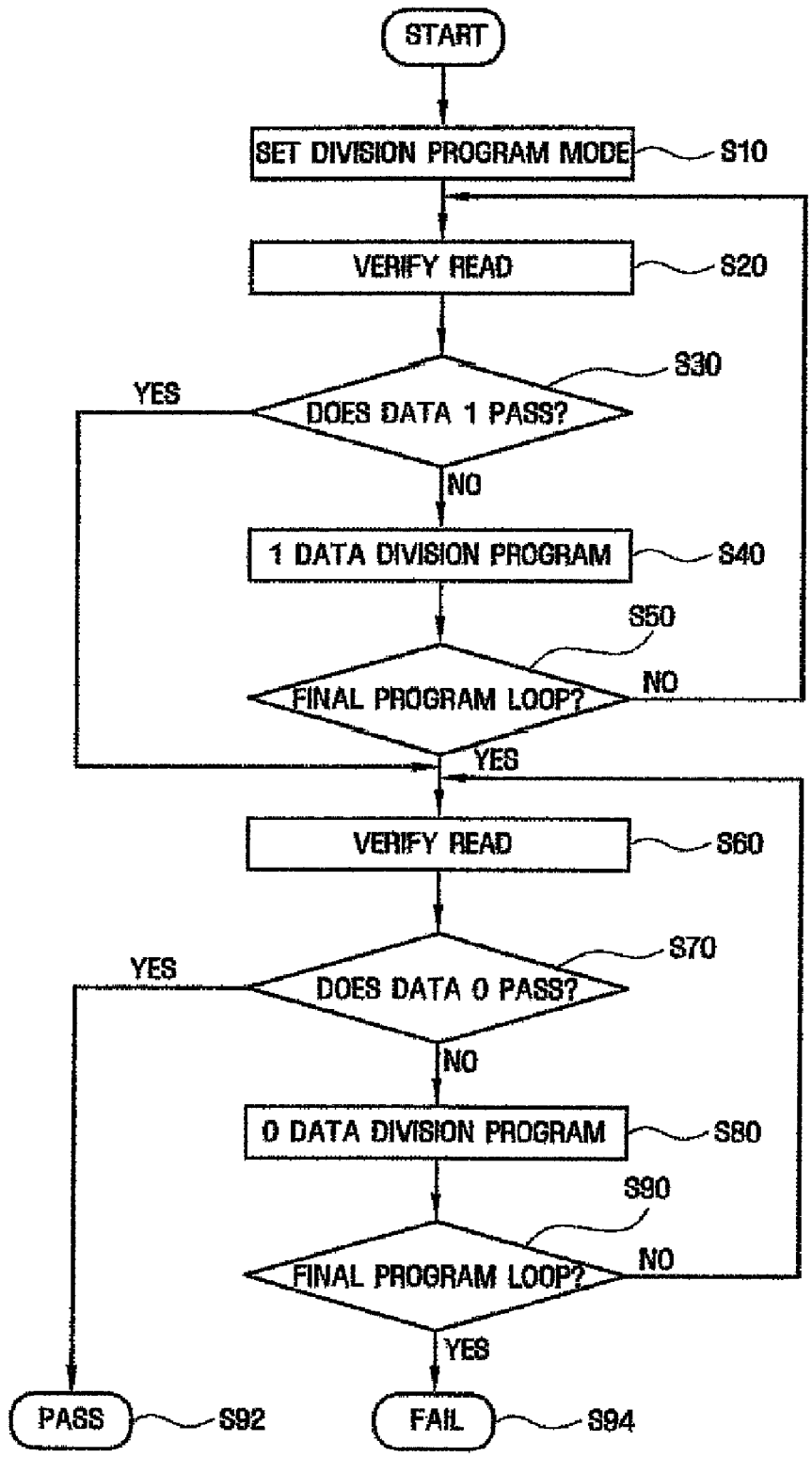
FIG. 7 is a flowchart illustrating a method of performing a program operation in a PRAM device according to an embodiment of the invention.

FIG. 7 is a flowchart illustrating a method of performing a program operation in a PRAM device according to an embodiment of the invention. More particularly, the flowchart shown in FIG. 7 illustrates one way of implementing verify read operations for the methods illustrated in FIGS. 2 and 3. In the description that follows, exemplary method steps are denoted by parentheses (SXX).

Referring to FIG. 7, first, a division program mode is set (S10). The division program mode determines the number of memory cells that are simultaneously programmed. For example, a set of sixteen selected memory cells could be divided into eight groups of two memory cells (×2 division program mode), four groups of four memory cells (×4 division program mode), two groups of eight memory cells (×8 division program mode), or one group of sixteen memory cells (×16 division program mode).

Next, a verify read operation is performed to determine whether the selected memory cells have been successfully programmed (S20). In the verify read operation, verification data VDATA is read from the selected memory cells and verification data VDATA is compared with program data WDATA representing desired logic states of the selected memory cells. Based on the comparison, the method determines whether all cell groups containing memory cells to be programmed with data "1" have been successfully programmed (S30). If yes (S30=Yes), the method jumps to a step S60. Otherwise (S30=NO), the method performs a program loop comprising division program operations for programming data "1" to all of the "failed groups" among the selected memory cells (S40). After step S40, the method determines whether the program loop was a final program loop for a first program interval (S50). If so (S50=YES), the method continues to step S60. Otherwise (S50=NO), the method returns to step S20 and repeats step S20 and subsequent steps.

In step S60, the method performs a verify read operation to determine whether the selected memory cells have been successfully programmed (S60). In the verify read operation, verification data VDATA is read from the selected memory cells and verification data VDATA is compared with program data WDATA representing desired logic states of the selected memory cells. Based on the comparison, the method determines whether all cell groups containing memory cells to be programmed with data "0" have been successfully programmed (S70). If yes (S70=Yes), the method terminates with a "pass" status (S92). Otherwise (S70=NO), the method performs a program loop comprising division program operations for programming data "0" to memory cells designated to be programmed with data "0" and in "failed groups" among the selected memory cells (S80). After step S80, the method determines whether the program loop was a final program loop for a second program interval (S90). If so (S90=YES), the method terminates with a "fail" status (S94). Otherwise (S90=NO), the method returns to step S60 and repeats step S60 and subsequent steps.

Where the method of FIG. 3 is used, division program operations are time shifted where possible for step S40 and step S80 to reduce the duration of each program loop.

Figure 8:
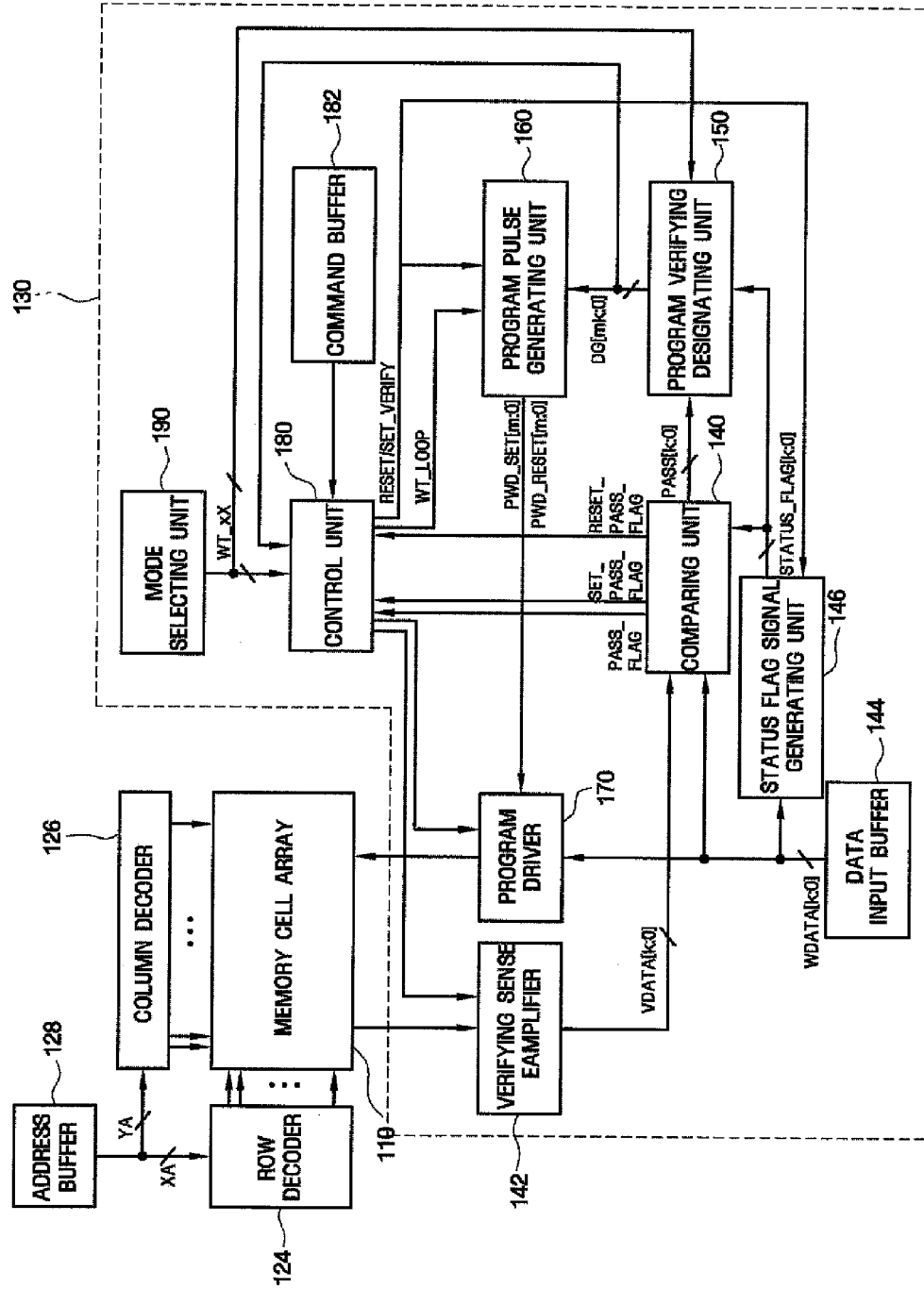
FIG. 8 is a block diagram illustrating a PRAM device according to an embodiment of the invention.

FIG. 8 is a block diagram illustrating a PRAM device according to an embodiment of the invention. For explanation purposes, it will be assumed that the PRAM device of FIG. 8 is designed to implement one of the methods of FIG. 2 or FIG. 3, or the flowchart of FIG. 7.

Referring to FIG. 8, the PRAM device comprises a memory cell array 110, a row decoder 124, a column decoder 126, an address buffer 128, and a programming circuit 130.

Memory cell array 110 comprises a plurality of phase change memory cells that can be divided into a plurality of cell groups. Although not shown in the drawings, each phase change memory cell comprises a phase change resistance material and an access element such as a transistor or a diode. The access element is used to control the supply of current to the phase change resistance material during program, read, and erase operations.

Row decoder 124 is provided with a row address XA output by address buffer 128, decodes row address XA, and selects a row of the plurality of phase change memory cells to be programmed. Column decoder 126 is provided with a column address YA output by address buffer 128, decodes column address YA, and selects columns of the plurality of phase change memory cells to be programmed based on the decoded column address YA.

Programming circuit 130 performs an adaptive verify read operation on the plurality of selected phase change memory cells. Specifically, programming circuit 130 compares verification data VDATA read out from the selected phase change memory cells with program data WDATA to be programmed to the selected phase change memory cells, identifies a plurality of "failed" phase change memory cells whose verification data VDATA and program data WDATA are different from each other, programs data in the failed phase change memory cells where data having a first logic state (e.g., data "1") is to be programmed, and programs data in the failed phase change memory cells where data having the second logic state (for example, data "0") is to be programmed.

Programming circuit 130 comprises a comparing unit 140, a verifying sense amplifier 142, a data input buffer 144, a status flag signal generating unit 146, a program verifying designating unit 150, a program pulse generating unit 160, a program driver 170, a control unit 180, a command buffer 182, and a mode selecting unit 190.

Status flag signal generating unit 146 receives program data WDATA from data input buffer 144 and generates a status flag signal STATUS_FLAG indicating a plurality of phase change memory cells where program data of a particular logic state is to be programmed from among the plurality of program data WDATA. Here, the program data of the particular logic state may be program data of a first logic state (e.g., data "1") or program data of a second logic state (e.g., data "0"). In this case, status flag signal generating unit 146 receives a program control signal RESET/SET_VERIFY from control unit 180 and generates a status flag signal indicating a plurality of phase change memory cells where program data of the first logic state is to be programmed or a status flag signal indicating a plurality of phase change memory cells where program data of the second logic state is to be programmed. Typically, status flag signal generating unit 146 first supplies a status flag signal indicating a plurality of phase change memory cells where program data of the first logic state is to be programmed, and then supplies a status flag signal indicating a plurality of phase change memory cells where program data of the second logic state is to be programmed.

Comparing unit 140 compares verification data VDATA read from plurality of phase change memory cells by verifying sense amplifier 142 with program data WDATA input by data input buffer 144, and outputs corresponding comparison signals PASS. Comparison signals PASS indicate a plurality of different failed phase change memory cells among "k" phase change memory cells, whose verification data VDATA and program data WDATA are different from each other. Further, comparing unit 140 receives verification data VDATA, program data WDATA, and status flag signal STATUS_FLAG, and supplies a pass flag signal PASS_FLAG, a reset pass flag signal RESET_PASS_FLAG, and a set pass flag signal SET_PASS_FLAG to control unit 180. Where verification data VDATA and program data WDATA are equal to each other, pass flag signal PASS_FLAG assumes a first logic state (e.g., logic state "high") and where verification data VDATA and program data WDATA are different from each other, pass flag signal PASS_FLAG assumes a second logic state (e.g., logic state "low").

Further, where all of the phase change memory cells where the program data of the first logic state (e.g., data "1") is to be programmed pass, reset pass flag signal RESET_PASS_FLAG assumes the first logic state and where all of the phase change memory cells where the program data of the first logic state is to be programmed do not pass, reset pass flag signal RESET_PASS_FLAG assumes the second logic state. Furthermore, where all of the phase change memory cells where the program data having the second logic state is to be programmed pass, set pass flag signal SET_PASS_FLAG assumes the first logic state, and where all of the phase change memory cells where the program data having the second logic state is to be programmed do not pass, set pass flag signal SET_PASS_FLAG assumes a second logic state.

Program verifying designating unit 150 receives comparison signal PASS, status flag signal STATUS_FLAG, and mode selecting signal WT_xX, and generates a designating signal DG for designating a plurality of division program operations, such that data is programmed in failed phase change memory cells where program data of a particular logic state is to be programmed among a plurality of phase change memory cells. Program verifying designating unit 150 is described below in further detail with reference to FIG. 9.

Program pulse generating unit 160 receives designating signal DG, program control signal RESET/SET_VERIFY, and a program loop signal WT_LOOP, and generates a set pulse control signal PWD_SET and a reset pulse control signal PWD_RESET at timing of a designated division program operation in a predetermined program loop.

Program driver 170 receives program data WDATA, set pulse control signal PWD_SET, and reset pulse control signal PWD_RESET, and generates a set pulse or a reset pulse corresponding to the program data to a failed phase change memory cell.

Control unit 180 receives a program command from command buffer 182, controls verifying sense amplifier 142, status flag signal generating unit 146, program driver 170, and program pulse providing unit 160, and performs an adaptive program verifying operation. Further, control unit 180 receives designating signal DG and adjusts a detailed operation of verifying sense amplifier 142 or the like, and receives flag signal PASS_FLAG with the first logic state and stops the adaptive program verifying operation. Furthermore, control unit 180 receives reset pass flag signal RESET_PASS_FLAG with the first logic state to suspend a division program operation of data of a first status, and receives set pass flag signal SET_PASS_FLAG of the first logic state level to suspend a division program operation of data of the second logic state. Meanwhile, control unit 180 is supplied with mode selecting signal WT_xX selecting a division program mode from mode selecting unit 190, and controls the operation of verifying sense amplifier 142 or the like according to the selected division program mode.

Figure 9:
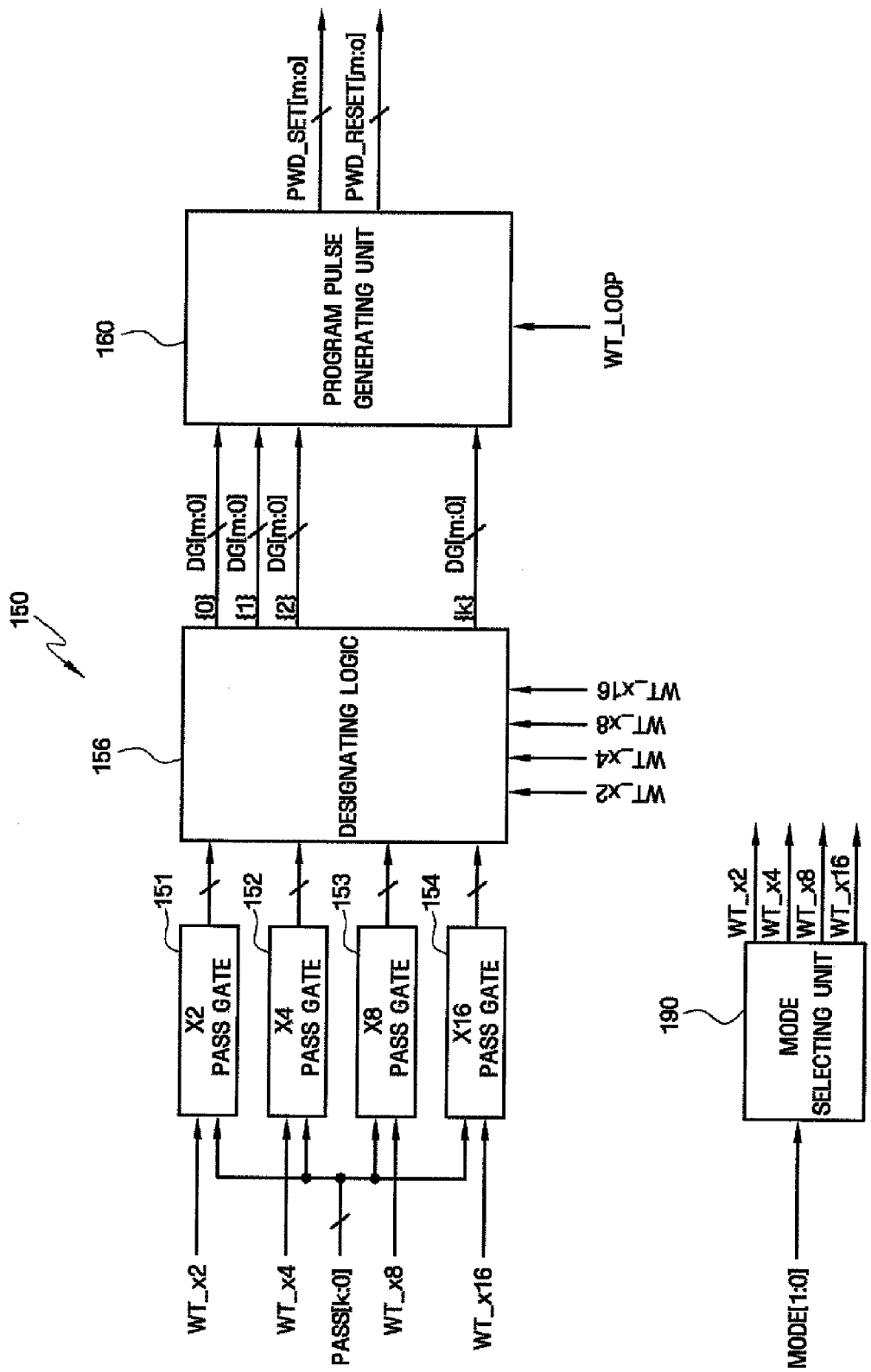
FIG. 9 is a block diagram illustrating an embodiment of a program verifying designating unit in the PRAM device of FIG. 8.

FIG. 9 is a block diagram illustrating an embodiment of a program verifying designating unit 150 in the PRAM device of FIG. 8. To provide context, mode selecting unit 190 and program pulse generating unit 160 are also shown.

Referring to FIG. 9, mode selecting unit 190 receives a mode control signal MODE and generates a plurality of mode selecting signals WT_x2, WT_x4, WT_x8, and WT_x16 for selecting division program modes. The mode selecting signal (e.g., WT_×2) corresponding to the selected division program mode assumes the first logic state and remaining mode selecting signals WT_×4, WT_×8, and WT_×16 assume the second logic state.

Program verifying designating unit 150 comprises a plurality of pass gates 151, 152, 153, and 154, and a designating logic unit 156.

Pass gates 151, 152, 153, and 154 correspond to a plurality of respective mode selecting signals. Pass gates 151, 152, 153, and 154 are supplied with respective mode selecting signals WT_×2, WT_×4, WT_×8, and WT_×16 and selectively transmit comparison signal PASS. Specifically, pass gate 151 supplied with mode selecting signal WT_×2 of the first logic state enables and transmits comparison signal PASS, and pass gates 152, 153, and 154 that are respectively supplied with mode selecting signals WT_×4, WT_×8, and WT_×16 of the second logic state are disabled.

Designating logic unit 156 receives comparison signal PASS, mode selecting signals WT_×2, WT_×4, WT_×8, and WT_×16, and status flag signal STATUS_FLAG, determines a predetermined program order of a plurality of failed cell groups including at least one failed phase change memory cell where program data of a specific logic state is to be programmed among a plurality of cell groups, and supplies designating signals DG designating the plurality of division program operations, such that data is programmed according to the determined program order. An example of a method of determining the program order has been described with reference to FIGS. 4A through 6.

Figure 10:
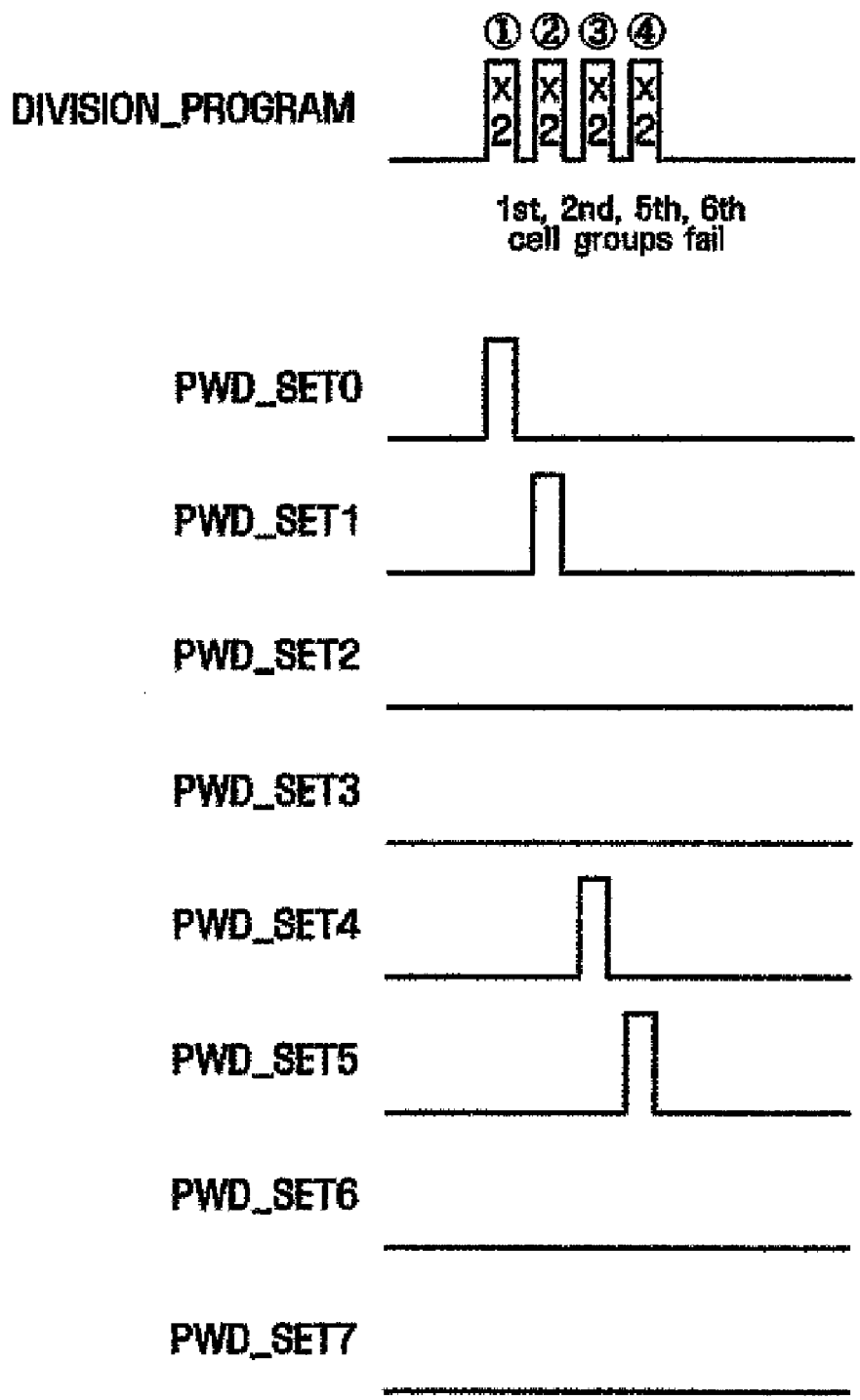
FIG. 10 is a timing chart illustrating an example of a set pulse control signal output by a program pulse generating unit in the PRAM device of FIG. 8.

FIG. 10 is a timing chart illustrating an example of a set pulse control signal output by program pulse generating unit 160. Program pulse generating unit 160 receives designating signal DG and program loop signal WT_LOOP, and outputs the set pulse control signal and the reset pulse control signal. For convenience of description, FIG. 10 shows set pulse control signals PWD_SET0 to PWD_SET7 generated when the phase change memory cells where data "0" is to be programmed in the first, second, and fifth and sixth cell groups fail in the first program loop (SL=1), as shown in the timing chart shown in FIG. 3.

Referring to FIG. 10, first through eighth set pulse control signals PWD_SET0 to PWD_SET7 correspond to first through eighth cell groups, respectively. Since the third, fourth, seventh, and eighth cell group have passed, the third, fourth, seventh, and eighth set pulse control signals PWD_SET2, PWD_SET3, PWD_SET6, and PWD_SET7 maintain logic state "low". The other first, second, and fifth, and sixth set pulse control signals PWD_SET0, PWD_SET1, PWD_SET4 and PWD_SET5 are sequentially generated without overlapping one another.

Figure 11:
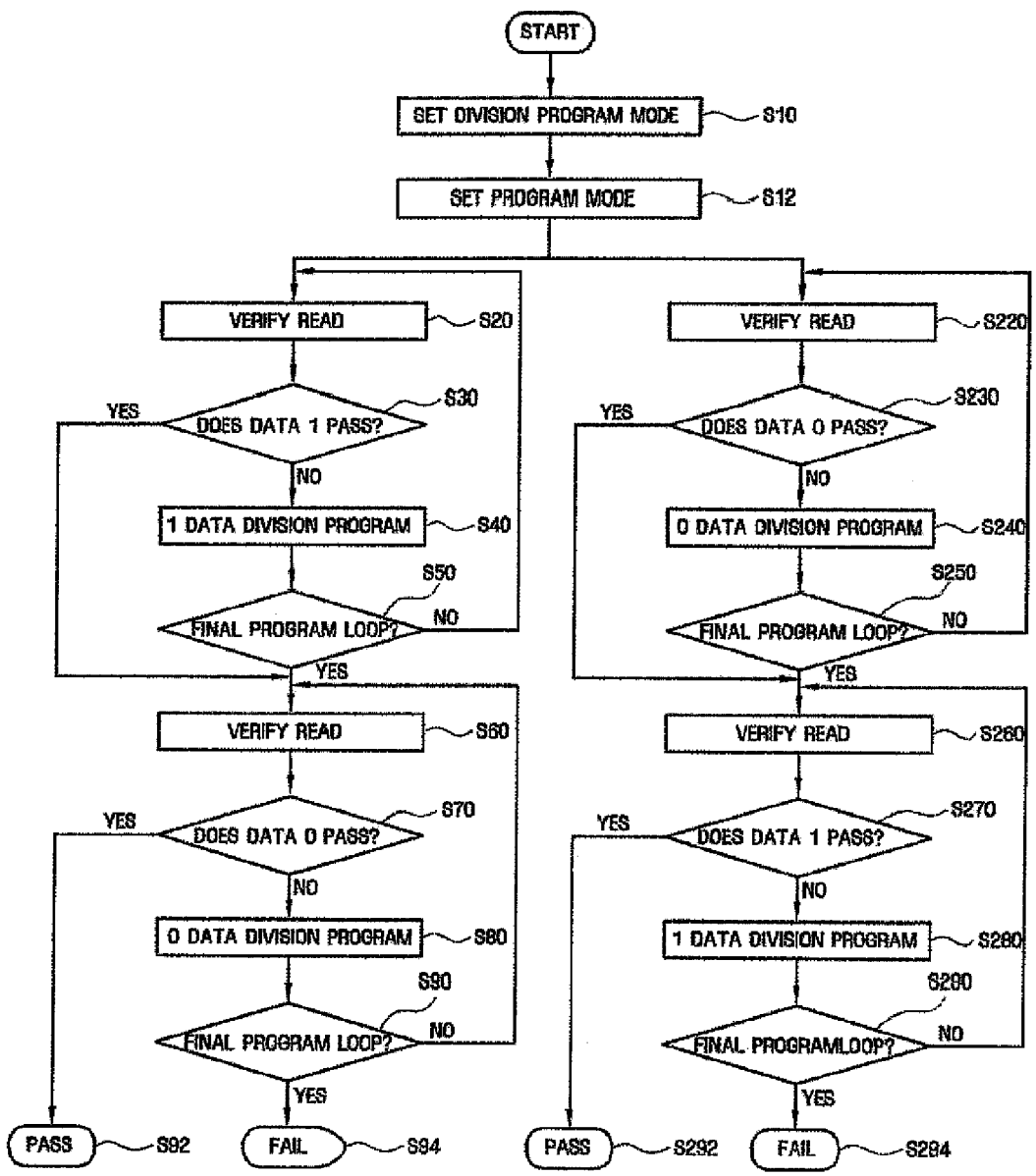
FIG. 11 is a flowchart illustrating method of performing a program operation in a PRAM device according to another embodiment of the invention.

FIG. 11 is a flowchart illustrating a method of performing a program operation in a PRAM device according to another embodiment of the invention. The same steps as those shown in FIG. 7 are denoted by the same reference numerals, and the detailed description of the steps already described will be omitted to avoid redundancy.

Referring to FIG. 11, first, a division program mode is set (S10), and the number phase change memory cells included in each cell group is determined. Then, a program mode is set (S12), and data "1" is programmed and data "0" is then programmed (S20 to S94), or data "0" is programmed and then data "1" is programmed (S220 to S294).

Specifically, the operation of writing data "0" after writing data "1" progresses in the order of the verify read operation (S20), step S30 determining whether the phase change memory cell where data "1" is to be programmed passes or not, the division program operation for data "1" (S40), step S50 determining whether the executed program loop corresponds to the final program loop, the verify read operation (S60), step S70 determining whether the phase change memory cell where data "0" is to be programmed passes, the 0 data division program process (S80), and step S90 determining whether the executed program loop corresponds to the final program loop.

Further, the operation of programming data "1" after programming data "0" progresses in the order of the verify read operation (S220), step S230 determining whether the phase change memory cell where data "1" is to be programmed passes or not, the division program operation for programming data "1" (S240), step S250 for determining whether the executed program loop corresponds to the final program loop, the verify read operation (S260), step S270 for determining whether phase change memory cells where data "0" is to be programmed passes, the division program operation for programming data "0" (S280), and step S290 for determining whether the executed program loop corresponds to the final program loop.

Those skilled in the art will recognize that PRAM devices for implementing the method of FIG. 11 can be formed using a design such as that illustrated in FIG. 8. A separate mode selecting unit may be provided to select a program mode.

According to selected embodiments of the invention, the time required to perform a program operation in selected memory cells of a nonvolatile memory device is reduced by programming selected memory cells to different logic states during different program intervals. The time required for program operations is further reduced by adjusting the duration of program loops in accordance with the number of division program operations to be performed in each program loop.

The foregoing exemplary embodiments are teaching examples. Those of ordinary skill in the art will understand that various changes in form and details may be made to the exemplary embodiments without departing from the scope of the invention as defined by the following claims.

What is claimed is:

1. A method of programming data to phase change memory cells in a nonvolatile memory, the nonvolatile memory including N groups of the memory cells, where N is greater than 2, the method comprising:

supplying a first state program signal to M memory cells selected from each one of the N groups, where M is greater than 2, and then verify-reading the M memory cells to determine whether the M memory cells are in the first state;

supplying a second state program signal different from the first state program signal to L memory cells selected from each one of the N groups, where L is greater than 2, and then verify-reading the L memory cells to determine whether the L memory cells are in the second state, wherein at least one memory cell in each one of the M memory cells and L memory cells is in each one of the N groups.

2. The method of claim 1, wherein the first and second program signals have different supplying durations to the M memory cells and L memory cells, respectively.

3. The method of claim 2, wherein supplying the first state program signal comprises simultaneously supplying the first state program signal to each one of the M memory cells in the N groups.

4. The method of claim 2, wherein supplying the second state program signal comprises simultaneously supplying the second state program signal to each one of the L memory cells in the N groups.

5. The method of claim 2, wherein supplying the first state program signal comprises sequentially supplying the first state program signal to each one of the M memory cells in the N groups.

6. The method of claim 2, wherein supplying the second state program signal comprises sequentially supplying the second state program signal to each one of the L memory cells in the N groups.

7. A method of performing a program operation in a nonvolatile memory device comprising a memory cell array of nonvolatile memory cells, the method comprising:
   setting a division program mode, wherein the division program mode determines a group of J memory cells in the memory cell array to be simultaneously programmed during a program operation;
   during a first program interval of the program operation, programming first state data to a first group of K memory cells selected from the J memory cells, wherein K is less than or equal to J; and
   during a second program interval of the program operation following the first program interval, programming second state data different from the first state data to a second group of L memory cells selected from the J memory cells, wherein L is less than or equal to J.

8. The method of claim 7, wherein programming the first state data to the first group of K memory cells comprises supplying a first state program signal to the K memory cells, and programming the second state data to the second group of L memory cells comprises supplying a second state program signal different from the first program signal to the L memory cells.

9. The method of claim 8, wherein the first and second program signals have different supplying durations to the K memory cells and L memory cells, respectively.

10. The method of claim 8, wherein the first program interval comprises a first number of sequentially performed first programming loops, and the second program interval comprises a second number of sequentially performed second programming loops.

11. The method of claim 10, wherein each one of the first programming loops has a similar duration.

12. The method of claim 10, wherein at least two of the first programming loops have different durations.

13. The method of claim 10, wherein each one of the second programming loops has a similar duration.

14. The method of claim 10, wherein at least two of the second programming loops have different durations.

15. The method of claim 7, wherein the J is equal to one of 2, 4 and 8.

16. The method of claim 7, wherein the first state data has a logical value of "1" and the second state data has a logical value of "0".

17. A memory device, comprising:
   a memory cell array including a plurality of nonvolatile memory cells;
   a mode selecting unit configured to set a division program mode, wherein the division program mode determines a group of J memory cells in the memory cell array to be simultaneously programmed during a program operation; and
   a program circuit configured during a first program interval of the program operation to program first state data to a first group of K memory cells selected from the J memory cells, wherein K is less than or equal to J, and further configured during a second program interval of the program operation following the first program interval to program second state data different from the first state data to a second group of L memory cells selected from the J memory cells, wherein L is less than or equal to J.

18. The memory device of claim 17, wherein J is equal to one of 2, 4 and 8.

19. The memory device of claim 17, wherein the first state data has a logical value of "1" and the second state data has a logical value of "0".

20. The memory device of claim 17, wherein the nonvolatile memory device is a phase change random access memory (PRAM) device.

* * * * *